United States Patent
Nagai et al.

(10) Patent No.: US 11,139,409 B2
(45) Date of Patent: Oct. 5, 2021

(54) CONCENTRATOR PHOTOVOLTAIC UNIT, CONCENTRATOR PHOTOVOLTAIC MODULE, CONCENTRATOR PHOTOVOLTAIC PANEL, AND CONCENTRATOR PHOTOVOLTAIC DEVICE

(71) Applicant: Sumitomo Electric Industries, Ltd., Osaka (JP)

(72) Inventors: Youichi Nagai, Osaka (JP); Takashi Iwasaki, Osaka (JP); Kenji Saito, Osaka (JP); Kazumasa Toya, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 15/744,229

(22) PCT Filed: Jun. 7, 2016

(86) PCT No.: PCT/JP2016/066853
§ 371 (c)(1),
(2) Date: Jan. 12, 2018

(87) PCT Pub. No.: WO2017/022325
PCT Pub. Date: Feb. 9, 2017

(65) Prior Publication Data
US 2018/0204969 A1 Jul. 19, 2018

(30) Foreign Application Priority Data
Aug. 3, 2015 (JP) .............................. JP2015-153199

(51) Int. Cl.
*H01L 31/054* (2014.01)
*H02S 40/22* (2014.01)

(52) U.S. Cl.
CPC ........ *H01L 31/0543* (2014.12); *H01L 31/054* (2014.12); *H02S 40/22* (2014.12); *Y02E 10/52* (2013.01)

(58) Field of Classification Search
None
See application file for complete search history.

(56) References Cited

U.S. PATENT DOCUMENTS 4,306,540 A * 12/1981 Hutchison ............. F24S 30/425
126/607
2002/0148497 A1 10/2002 Sasaoka et al.
(Continued)

FOREIGN PATENT DOCUMENTS

CN 203674253 U 6/2014
CN 104205348 A 12/2014
(Continued)

OTHER PUBLICATIONS

English Machine Translation JP 2013211487, accessed Jun. 24, 19 (Year: 2013).*
(Continued)

*Primary Examiner* — Shannon M Gardner
(74) *Attorney, Agent, or Firm* — Baker Botts L.L.P.; Michael A. Sartori

(57) ABSTRACT

When upper-lower positional relationship on an optical path is defined such that the primary concentrating portion is at an upper position than the secondary concentrating portion, the secondary concentrating portion includes: a secondary lens provided above the power generating element; a lens supporting portion configured to support the secondary lens; and a shielding plate being a flat-plate-shaped member preventing sunlight to pass therethrough whereas allowing an upper portion of the secondary lens to be exposed from a hole formed in the flat-plate-shaped member, the shielding plate being fixed in a state of being mounted to the lens
(Continued)

supporting portion, the shielding plate being configured to block light converging at a position outside the secondary lens.

15 Claims, 16 Drawing Sheets

(56) References Cited

U.S. PATENT DOCUMENTS

| | | |
|---|---|---|
| 2006/0060867 A1 | 3/2006 | Suehiro |
| 2009/0133737 A1 | 5/2009 | Anzawa et al. |
| 2010/0236603 A1 | 9/2010 | Menard et al. |
| 2010/0326494 A1 | 12/2010 | Okamoto |
| 2011/0067758 A1 | 3/2011 | Plesniak |
| 2011/0241028 A1 | 10/2011 | Park et al. |
| 2013/0146120 A1 | 6/2013 | Seel et al. |
| 2015/0083193 A1 | 3/2015 | Ueda |
| 2015/0096608 A1 | 4/2015 | Lee et al. |
| 2016/0204736 A1 | 7/2016 | Toya et al. |

FOREIGN PATENT DOCUMENTS

| | | |
|---|---|---|
| CN | 104205620 A | 12/2014 |
| JP | S60-063969 A | 4/1985 |
| JP | 2003-174183 A | 6/2003 |
| JP | 2007-201109 A | 8/2007 |
| JP | 2013-211487 A | 10/2013 |
| JP | 2014-017079 A | 1/2014 |
| JP | 2014-063779 A | 4/2014 |
| JP | 2014-225543 A | 12/2014 |
| JP | 2015-133364 A | 7/2015 |
| KR | 200453847 Y1 | 5/2011 |
| WO | 2006/132265 A1 | 12/2006 |
| WO | 2013/130152 A2 | 9/2013 |
| WO | 2015/064178 A1 | 5/2015 |

OTHER PUBLICATIONS

English Machine Translation JP 2007201109, accessed Jun. 24, 19 (Year: 2007).*

U.S. Appl. No. 15/744,191, filed Jan. 12, 2018 [Related Application, Provided in IFW].

Office Action dated Mar. 29, 2019 issued for the co-pending U.S. Appl. No. 15/744,191.

Office Action issued in U.S. Appl. No. 15/744,191, dated Jul. 12, 2018 [Related Application, provided in IFW].

Advisory Action dated Feb. 15, 2019 issued for the co-pending U.S. Appl. No. 15/744,191.

Office Action issued in co-pending U.S. Appl. No. 15/744,191, dated Dec. 5, 2018 [Related Application; available in IFW].

Office Action in co-pending U.S. Appl. No. 15/744,191, dated Sep. 12, 2019.

Notice of Allowance issued in U.S. Appl. No. 15/744,191 dated Apr. 10, 2020.

Advisory Action issued in U.S. Appl. No. 15/744,191 dated Jan. 14, 2020.

Office Action issued in U.S. Appl. No. 15/744,191 dated Sep. 4, 2020.

* cited by examiner

CONCENTRATOR PHOTOVOLTAIC UNIT, CONCENTRATOR PHOTOVOLTAIC MODULE, CONCENTRATOR PHOTOVOLTAIC PANEL, AND CONCENTRATOR PHOTOVOLTAIC DEVICE

TECHNICAL FIELD

The present invention relates to a concentrator photovoltaic (CPV) unit, a concentrator photovoltaic module, a concentrator photovoltaic panel, and a concentrator photovoltaic apparatus. This application claims priority based on Japanese Patent Application No. 2015-153199 filed on Aug. 3, 2015, the entire contents of which are incorporated herein by reference.

BACKGROUND ART

A unit serving as an optical basic unit for concentrator photovoltaic power generation includes, for example, a primary lens being a convex lens, a secondary lens being a sphere lens, and a power generating element (for example, see PATENT LITERATURE 1 (FIG. 8)). As the power generating element, a solar cell having high power generation efficiency is used. Sunlight is concentrated by the primary lens to be incident on the secondary lens, and then, is further concentrated by the secondary lens to reach the power generating element.

Such a configuration allows much light energy to be concentrated onto a small power generating element, whereby power can be generated with high efficiency. A large number of such concentrator photovoltaic units are arranged in a matrix shape to form a concentrator photovoltaic module, and then, a large number of the modules are arranged in a matrix shape to form a concentrator photovoltaic panel. The concentrator photovoltaic panel forms a concentrator photovoltaic apparatus, together with a driving device for causing the panel to perform tracking operation while facing the sun.

The secondary lens is provided in order to concentrate light energy onto a small area, thereby reducing the area necessary for the expensive power generating element as much as possible, and moreover, in order to reduce deviation in tracking the sun and reduce influence of an error in the mounting position of the power generating element relative to the primary lens, thereby increasing concentrating accuracy. That is, in a case of the primary lens alone, when the optical axis is displaced due to tracking deviation or an error in the mounting position, a part of the concentrated light goes outside the light receiving surface of the power generating element. In this case, power generation efficiency is reduced. Thus, in order to guide light to the power generating element even if some displacement of the optical axis has occurred, the secondary lens being a sphere lens or a hemisphere lens is provided (for example, see PATENT LITERATURE 1 (FIG. 5b), PATENT LITERATURE 2 (FIG. 1), and PATENT LITERATURE 3). The secondary lens is fixed so as to be slightly spaced from the power generating element by means of a support member.

CITATION LIST

Patent Literature

PATENT LITERATURE 1: US Patent Application Publication No. US2010/0236603A1
PATENT LITERATURE 2: Japanese Laid-Open Patent Publication No. 2014-63779
PATENT LITERATURE 3: International Publication No. WO2015/064178A1

SUMMARY OF INVENTION

A concentrator photovoltaic unit according to the present disclosure is a concentrator photovoltaic unit configured to guide sunlight concentrated by a primary concentrating portion, to a power generating element by means of a secondary concentrating portion, wherein when upper-lower positional relationship on an optical path is defined such that the primary concentrating portion is at an upper position than the secondary concentrating portion, the secondary concentrating portion includes: a secondary lens provided above the power generating element; a lens supporting portion configured to support the secondary lens; and a shielding plate being a flat-plate-shaped member preventing sunlight to pass therethrough whereas allowing an upper portion of the secondary lens to be exposed from a hole formed in the flat-plate-shaped member, the shielding plate being fixed in a state of being mounted to the lens supporting portion, the shielding plate being configured to block light converging at a position outside the secondary lens.

If a concentrator photovoltaic module is obtained as an assembly of such concentrator photovoltaic units, and then, a concentrator photovoltaic panel obtained as an assembly of such concentrator photovoltaic modules and a driving device for tracking the sun are included, a concentrator photovoltaic apparatus can be obtained.

BRIEF DESCRIPTION OF DRAWINGS

FIG. 2 is a diagram showing one example of a concentrator photovoltaic system including a driving device and the like.

DESCRIPTION OF EMBODIMENTS

Technical Problem

Figure 1:
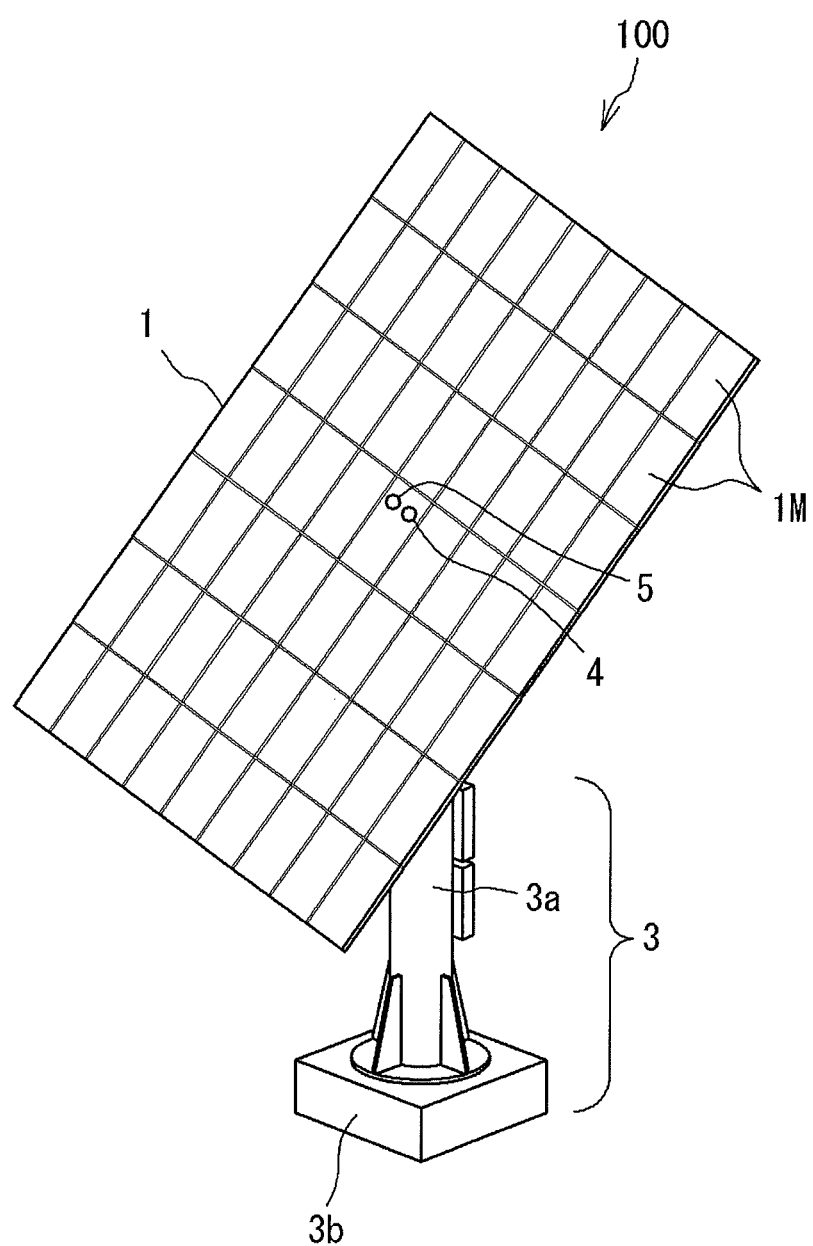
FIG. 1 is a perspective view showing one example of a concentrator photovoltaic apparatus.

In order to further improve the secondary concentrating portion including the secondary lens, the power generating element, and the lens supporting portion, it is conceivable that: for example, the secondary concentrating portion is caused to have a structure that is easy to be produced and that increases light transmittance (for example, see PATENT LITERATURE 3); and protection of surroundings of the power generating element at the time when the light concentration position is displaced is realized by means of a simple and easy-to-produce structure. If at least one of these is improved, a secondary concentrating portion having further enhanced completeness can be obtained.

Therefore, an object of the present disclosure is to further enhance the completeness of the structure of a secondary concentrating portion in a concentrator photovoltaic unit in consideration of the production process.

Advantageous Effects of the Present Disclosure

According to the present disclosure, completeness of the structure of the secondary concentrating portion in the concentrator photovoltaic unit can be further enhanced.

Summary of Embodiments

Summary of embodiments of the present invention includes at least the following.

(1) This is a concentrator photovoltaic unit configured to guide sunlight concentrated by a primary concentrating portion, to a power generating element by means of a secondary concentrating portion, wherein when upper-lower positional relationship on an optical path is defined such that the primary concentrating portion is at an upper position than the secondary concentrating portion, the secondary concentrating portion includes: a secondary lens provided above the power generating element; a lens supporting portion configured to support the secondary lens; and a shielding plate being a flat-plate-shaped member preventing sunlight to pass therethrough whereas allowing an upper portion of the secondary lens to be exposed from a hole formed in the flat-plate-shaped member, the shielding plate being fixed in a state of being mounted to the lens supporting portion, the shielding plate being configured to block light converging at a position outside the secondary lens.

In the concentrator photovoltaic unit described above, the shielding plate is one element forming the secondary concentrating portion and is fixed in a state of being mounted to the lens supporting portion. As a result of the shielding plate blocking the light converging at a position outside the secondary lens, burning of the lens supporting portion and others under the shielding plate can be prevented.

(2) In the concentrator photovoltaic unit according to (1), the shielding plate is a disk-like member having the hole formed in a center thereof.

In this case, an inexpensive member having a simple shape and a light weight, such as a washer, can be used as the shielding plate.

(3) The concentrator photovoltaic unit according to (1) or (2) may include: a covering portion made of translucent resin, the covering portion being configured to cover a surface of the secondary lens; and a sealing portion made of translucent resin, the sealing portion filling a space of a gap between the power generating element and the secondary lens, in the lens supporting portion.

In this case, since the covering portion is present between the secondary lens and air, reflection of light is suppressed and power generation efficiency is improved. The sealing portion seals the power generating element, thereby protecting the power generating element so as not to allow water, dust, or the like to attach to the power generating element.

(4) The concentrator photovoltaic unit according to (1) or (2) may have a configuration in which an upper end face of the lens supporting portion is a flat face configured to have the shielding plate to be fixed thereto, the upper end face being configured to support the secondary lens at an inner edge of the flat face.

In this case, the lens supporting portion not only supports the secondary lens, but also is used for fixation of the shielding plate. In addition, the shape of the upper end face of the lens supporting portion is simple.

(5) The concentrator photovoltaic unit according to (3) may have a configuration in which the upper end face of the lens supporting portion includes: a lower stage portion at an inner side, the lower stage portion being configured to support the secondary lens at an inner edge of the lower stage portion, and configured to serve as a resin receiving portion receiving a lower end of the covering portion; and a higher stage portion at an outer side, the higher stage portion being at a higher position than the lower stage portion and being configured to have the shielding plate mounted thereto.

In this case, the shielding plate can be supported at the higher stage portion, and the secondary lens can be supported at the lower stage portion. In addition, when the covering portion is formed by dripping liquid resin onto the secondary lens, the lower stage portion can serve as a receiver for the liquid resin, and the higher stage portion can reliably prevent the liquid resin from overflowing to the outer side.

(6) In the concentrator photovoltaic unit according to (5), an inner dimension of the hole in the shielding plate may be formed so as to be greater than an outer dimension of the secondary lens having the covering portion attached thereto.

In this case, in the production process, the shielding plate can be mounted after the covering portion has been formed, and the shielding plate does not interfere with the covering portion.

(7) In the concentrator photovoltaic unit according to (5), an edge portion of the hole in the shielding plate may be entered into the covering portion.

In this case, the shielding plate can be fixed by the covering portion.

(8) In the concentrator photovoltaic unit according to any one of (1) to (7), the lens supporting portion may be a part of a package accommodating the power generating element.

In this case, the lens supporting portion can be easily and accurately made, integrally with the package. In addition, the power generating element and the secondary lens which are supported by the common package can accurately maintain optical positional relationship therebetween.

(9) The concentrator photovoltaic unit according to (1) or (2) may have a configuration in which the sealing portion made of translucent resin and filling the space of the gap between the power generating element and the secondary lens also serves as the lens supporting portion.

In this case, the respective portions having stable quality can be uniformly made through resin molding, for example.

(10) In the concentrator photovoltaic unit according to any one of (1) to (9), the shielding plate may have a size that allows the shielding plate to also shield a bypass diode from light converging at a position outside the secondary lens, the bypass diode being connected in parallel to the power generating element and being provided outside a package accommodating the power generating element.

As a result of the shielding plate blocking the light converging at a position outside the secondary lens, burning of the bypass diode under the shielding plate can be prevented.

(11) A concentrator photovoltaic module can be formed by arranging a plurality of the concentrator photovoltaic units according to (1).

(12) A concentrator photovoltaic panel can be formed by arranging a plurality of the concentrator photovoltaic modules according to (11).

(13) A concentrator photovoltaic apparatus can include: the concentrator photovoltaic panel according to (12); and a driving device configured to drive the concentrator photovoltaic panel such that the concentrator photovoltaic panel tracks movement of the sun while facing a direction of the sun.

Details of Embodiments

<<Concentrator Photovoltaic Apparatus/Concentrator Photovoltaic Panel>>

Hereinafter, details of embodiments of the present invention are described with reference to the drawings. First, a configuration of the concentrator photovoltaic apparatus is described.

FIG. 1 is a perspective view showing one example of the concentrator photovoltaic apparatus. In the drawing, a concentrator photovoltaic apparatus 100 includes: a concentrator photovoltaic panel 1; and a pedestal 3 which includes a post 3a and a base 3b thereof, the post 3a supporting the concentrator photovoltaic panel 1 at the rear face side thereof. The concentrator photovoltaic panel 1 is formed by assembling a large number of concentrator photovoltaic modules 1M vertically and horizontally. In this example, 62 (7 in length×9 in breadth−1) concentrator photovoltaic modules 1M are assembled vertically and horizontally except the center portion. When one concentrator photovoltaic module 1M has a rated output of, for example, about 100 W, the entirety of the concentrator photovoltaic panel 1 has a rated output of about 6 kW. It should be noted that these numerical values are merely examples.

At the rear face side of the concentrator photovoltaic panel 1, a driving device (not shown) is provided, and through operation of the driving device, the concentrator photovoltaic panel 1 can be driven in two axes of the azimuth and the elevation. Accordingly, the concentrator photovoltaic panel 1 is driven so as to always face the direction of the sun in both of the azimuth and the elevation. At a place (in this example, the center portion) in the concentrator photovoltaic panel 1 or in the vicinity of the panel 1, a tracking sensor 4 and a pyrheliometer 5 are provided. Operation of tracking the sun is performed, relying on the tracking sensor 4 and the position of the sun calculated from the time, the latitude, and the longitude of the installation place.

That is, every time the sun has moved by a predetermined angle, the driving device drives the concentrator photovoltaic panel 1 by the predetermined angle. The event that the sun has moved by the predetermined angle may be determined by the tracking sensor 4, or may be determined by the latitude, the longitude, and the time. Thus, there are cases where the tracking sensor 4 is omitted. The predetermined angle is, for example, a constant value, but the value may be changed in accordance with the altitude of the sun and the time.

Figure 2:
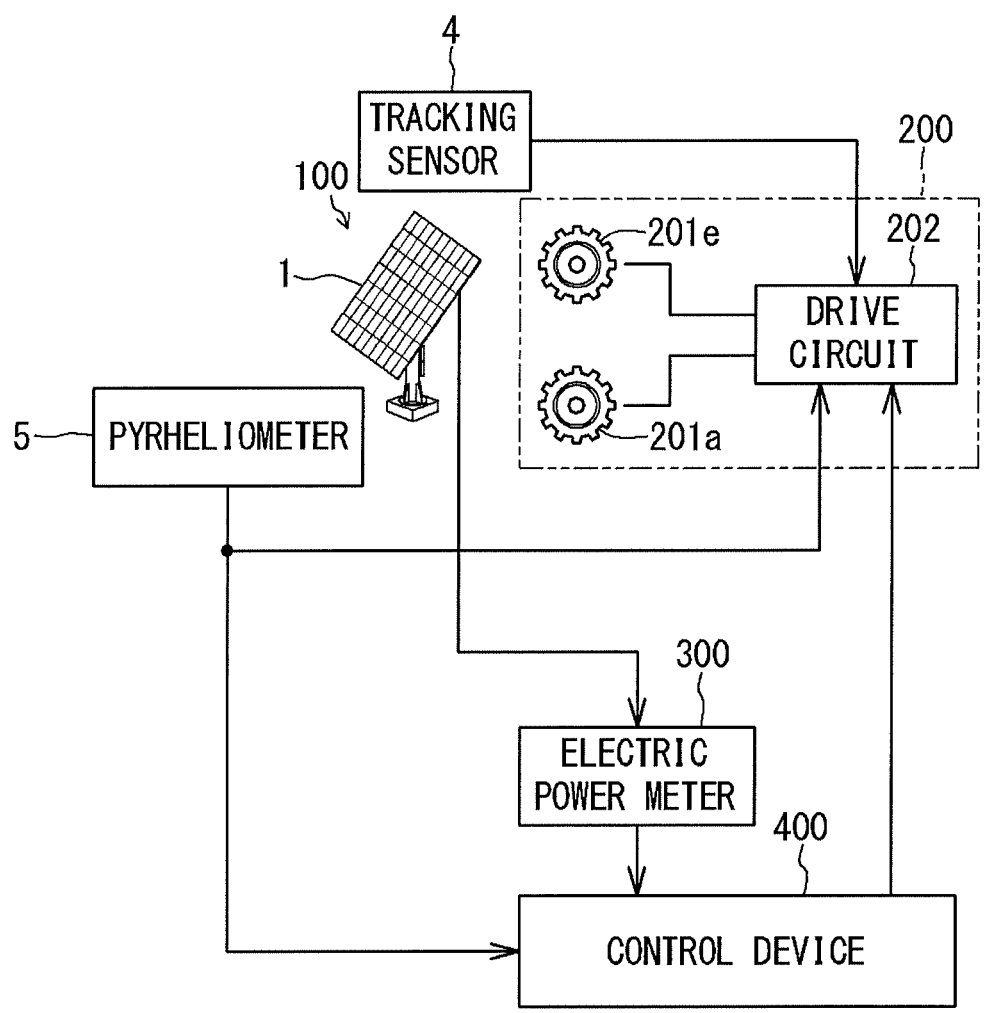

FIG. 2 is a diagram showing one example of a concentrator photovoltaic system including the driving device and the like. This diagram is expressed from the viewpoint of tracking operation control. In FIG. 2, as described above, the concentrator photovoltaic apparatus 100 includes, at the rear face side thereof, a driving device 200 for operation of tracking the sun, for example. The driving device 200 includes: a stepping motor 201e for drive in the elevation direction; a stepping motor 201a for drive in the azimuth direction; and a drive circuit 202 for driving these. It should be noted that these stepping motors are merely examples, and another power source may be used.

An output signal from the pyrheliometer 5 is inputted to the drive circuit 202 and a control device 400. Power generated by the concentrator photovoltaic panel 1 can be detected by an electric power meter 300, and a signal indicating the detected electric power is inputted to the control device 400. The driving device 200 stores the latitude and the longitude of the installation place of the concentrator photovoltaic panel 1, and has a function of a clock. On the basis of an output signal from the tracking sensor 4 and the position of the sun calculated from the latitude, the longitude, and the time, the driving device 200 causes tracking operation to be performed such that the concentrator photovoltaic panel 1 always faces the sun. However, as described above, there are cases where the tracking sensor 4 is not provided. In such a case, tracking operation is performed on the basis of only the position of the sun calculated from the latitude, the longitude, and the time.

<<One Example of Concentrator Photovoltaic Module>>

Figure 3:
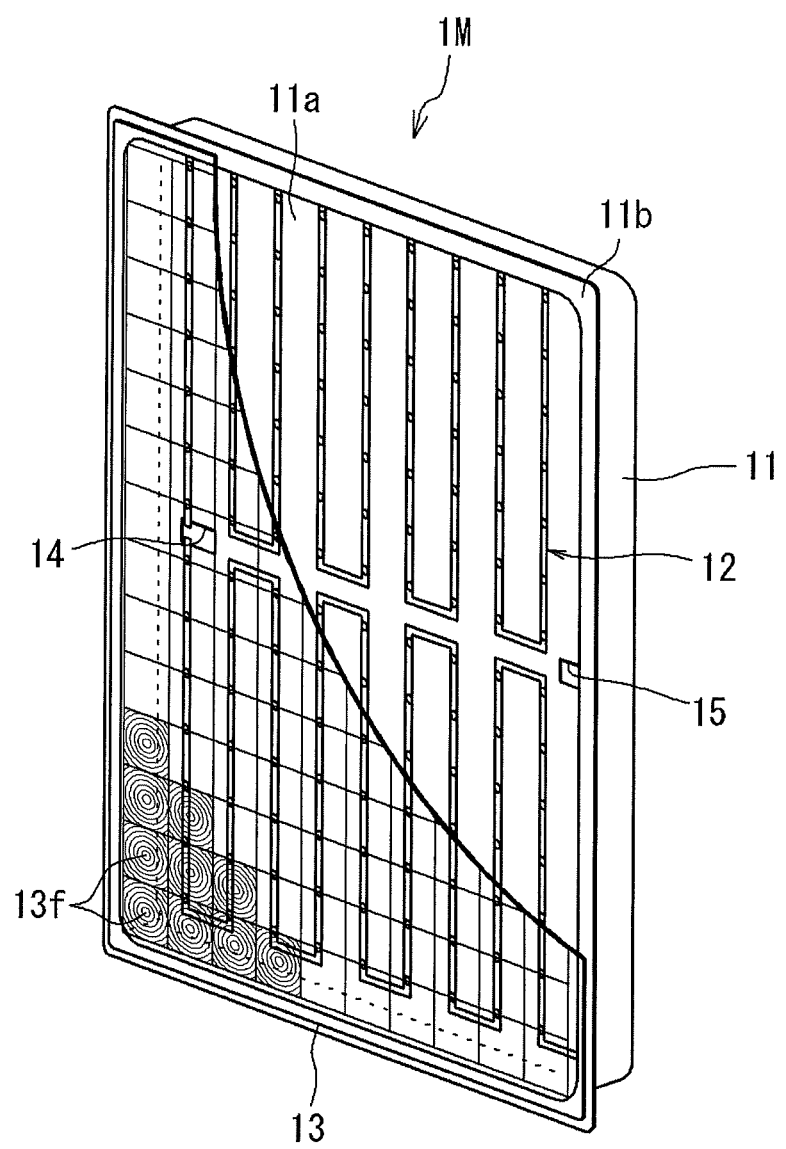
FIG. 3 is an enlarged perspective view (partially cut out) showing one example of a concentrator photovoltaic module.

FIG. 3 is an enlarged perspective view (partially cut out) showing one example of a concentrator photovoltaic module (hereinafter, also simply referred to as module) 1M. In the drawing, the module 1M includes as major components: a housing 11 formed in a rectangular vessel shape and having a bottom face 11a; a flexible printed circuit 12 provided in contact with the bottom face 11a; and a primary concentrating portion 13 attached, like a cover, to a flange portion 11b of the housing 11. At least the bottom face 11a of the housing 11 is made of metal. Ends of the output of the flexible printed circuit 12 are separately connected, at the positive side and the negative side, to connection boxes 14, 15 provided so as to protrude from the bottom face 11a to the rear face side, for example. It should be noted that the shape and arrangement of the flexible printed circuit 12 are merely examples, and other various shapes and arrangements can be employed.

The primary concentrating portion 13 is a Fresnel lens array and is formed by arranging, in a matrix shape, a plurality of (for example, 14 in length×10 in breadth, 140 in total) Fresnel lenses 13f serving as lens elements which concentrate sunlight. The primary concentrating portion 13 can be obtained by, for example, forming a silicone resin film at a back surface (inside) of a glass plate used as a base material. Each Fresnel lens is formed at this resin film.

Figure 4:
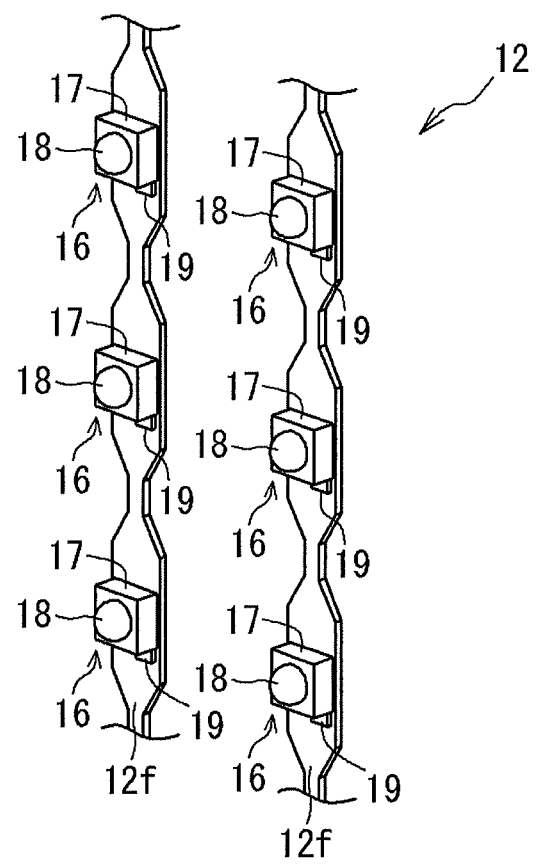
FIG. 4 is an enlarged perspective view of a flexible printed circuit.

FIG. 4 is an enlarged perspective view of the flexible printed circuit 12. Although shown in a simplified manner with details omitted in FIG. 3, the flexible printed circuit 12 of this example shown in FIG. 4 has a conductive pattern (not shown) formed at a flexible substrate 12f, and has power generating elements (not shown in FIG. 4) mounted thereto. Each power generating element is incorporated in a corresponding package 17. A secondary lens 18 being a sphere lens is mounted to the package 17. The package 17 including the power generating element and the secondary lens 18 form a secondary concentrating portion 16. A bypass diode 19 is provided at the outside of the package 17. The width of the flexible substrate 12f of this example is increased at places where the secondary concentrating portions 16 are mounted, and is decreased in the other places, thereby reducing the amount of the substrate material.

<<Concentrator Photovoltaic Unit>>

Figure 5:
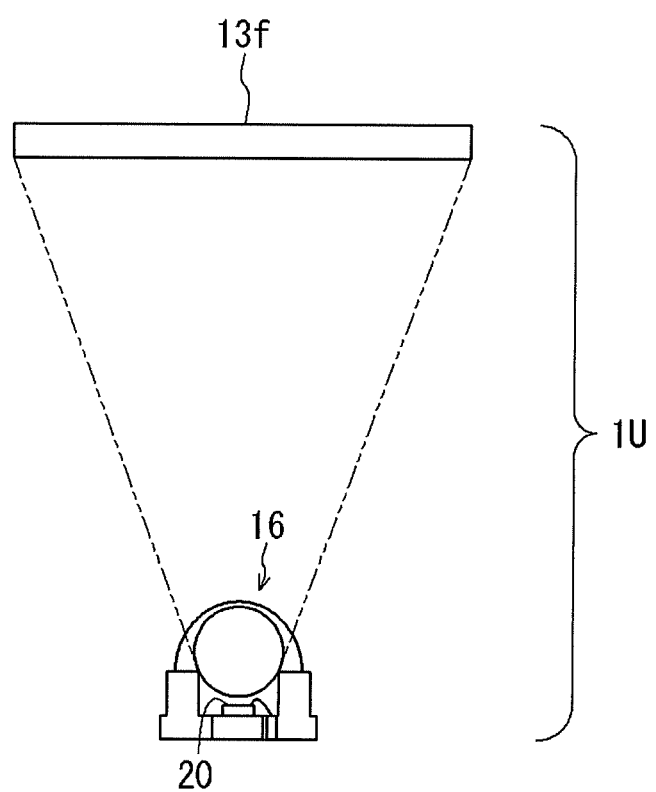
FIG. 5 is a schematic diagram showing a concentrator photovoltaic unit as an optical basic unit for forming a module.

FIG. 5 is a schematic diagram showing a concentrator photovoltaic unit (hereinafter, also simply referred to as unit) 1U serving as an optical basic unit for forming the module 1M described above. That is, in the unit 1U, sunlight concentrated by the Fresnel lens 13f (primary lens) serving as the primary concentrating portion is guided by the secondary concentrating portion 16 to a power generating element 20 incorporated therein.

Here, with respect to the upper-lower positional relationship on the optical path, assuming that the primary concentrating portion (Fresnel lens 13f) is at an upper position than the secondary concentrating portion 16, wording indicating directionality such as "upper" or "lower" is used.

<<Configuration of Secondary Concentrating Portion>>

Hereinafter, embodiments of the configuration of the secondary concentrating portion 16 are described.

First and second embodiments are focused on causing the secondary concentrating portion 16 to have a structure that is easy to be produced and that increases light transmittance. Third to seventh embodiments are focused on realization of protection of surroundings of the power generating element at the time when the light concentration position is displaced, by means of a simple and easy-to-produce structure.

However, at least parts of the embodiments may be combined to each other as desired.

First Embodiment

Figure 6A:
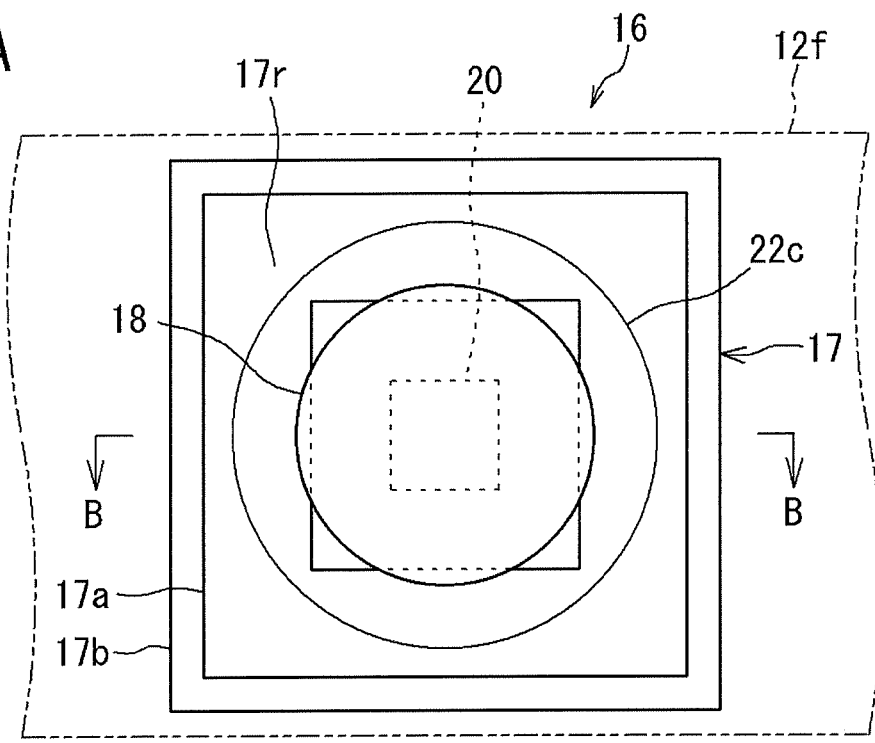
FIG. 6A is a plan view showing a first embodiment of a secondary concentrating portion.
Figure 6B:
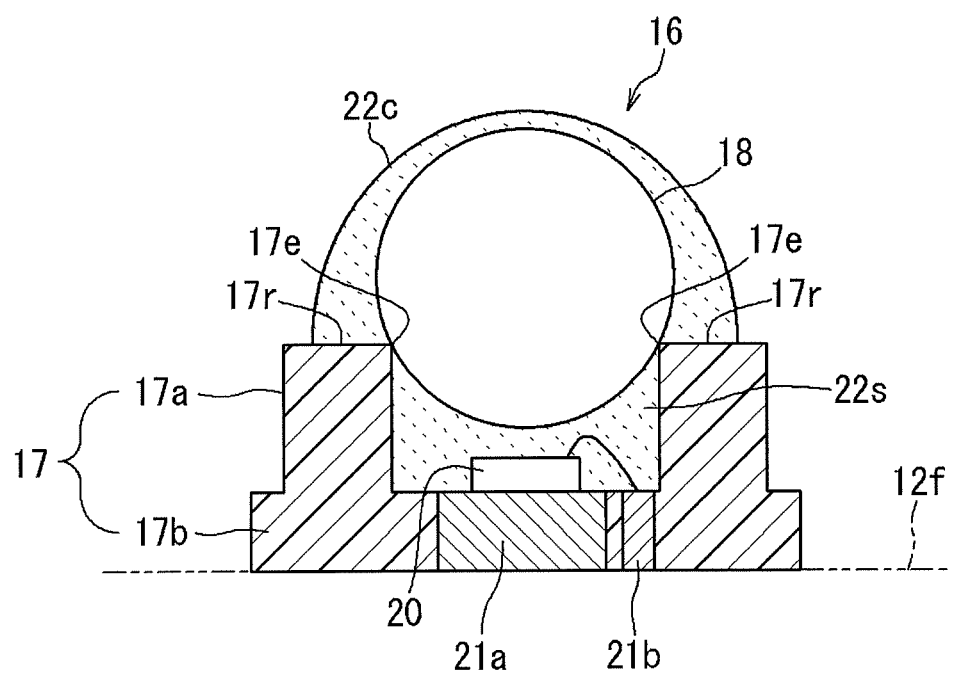
FIG. 6B is a cross-sectional view along a line B-B in FIG. 6A.

FIG. 6A is a plan view showing a first embodiment of the secondary concentrating portion 16, and FIG. 6B is a cross-sectional view along a line B-B in FIG. 6A. In FIG. 6A and FIG. 6B, the power generating element 20 is mounted to the package 17 made of resin. Lead frames 21a, 21b for electric connection and embedded in a bottom portion of the package 17 are connected to both electrodes of the power generating element 20, respectively. As the resin forming the package 17, polyamide or epoxy is suitable, for example.

The package 17 includes a lens supporting portion 17a integrally with a bottom portion 17b. The lens supporting portion 17a is a frame-shaped mount which surrounds the power generating element 20 and at which the secondary lens 18 is placed. It should be noted that this "frame-shaped mount" has a quadrangular tube shape, but may have a cylindrical shape or any of various polygonal tube shapes. The upper end face of the lens supporting portion 17a is a flat surface, and serves as a resin receiving portion 17r. The secondary lens 18 is in contact with an inner edge 17e of the upper end face.

Since the lens supporting portion 17a is a part of the package 17, the lens supporting portion 17a can be easily and accurately made, integrally with the package 17. In addition, the power generating element 20 and the secondary lens 18 which are supported by the common package 17 can accurately maintain optical positional relationship therebetween.

The secondary lens 18 is a sphere lens and is supported by the lens supporting portion 17a, slightly separated (distanced) from the power generating element 20. The space of the gap between the power generating element 20 and the secondary lens 18 in the lens supporting portion 17a is filled with translucent resin, thereby forming a sealing portion 22s. The power generating element 20 is sealed with the sealing portion 22s, thereby being protected so as not to allow water, dust, and the like to attach to the power generating element 20. The resin for the sealing portion 22s is silicone, for example. The resin is poured in a liquid state, is solidified, and becomes the sealing portion 22s.

The surface of the secondary lens 18 above the lens supporting portion 17a is covered by a covering portion 22c. Similarly to the sealing portion 22s, the covering portion 22c is made of translucent resin and the resin is silicone, for example. Silicone in a liquid state is dripped onto the top of the secondary lens 18, whereby the covering portion 22c can be easily formed. Although shown in a simplified manner in FIG. 6B, at the surface of the substantially upper hemisphere of the secondary lens 18, the covering portion 22c is solidified in a thin film shape, and the lower end of the covering portion 22c is solidified in a slightly accumulated state on the resin receiving portion 17r.

In FIG. 6B, the aforementioned "thin film shape" is depicted to be rather thick for convenience of drawing, but the thickness of the thin film is not greater than 0.2 mm, for example. While the refractive index of air is 1.0, the refractive indexes of the secondary lens 18 and the covering portion 22c are as follows, for example. This numerical value range allows suitable refractive indexes to be set for light having wavelengths from ultraviolet light (wavelength 300 nm) to infrared light (wavelength 2000 nm) contained in sunlight.

Secondary lens: 1.40 to 1.60
Covering portion: 1.35 to 1.55

The refractive index of the covering portion 22c is greater than that of air. In addition, as the covering portion 22c, a covering portion having a refractive index smaller than that of the secondary lens 18 is selected. Due to the relationship among these and the covering portion 22c having a thin film shape, reflection of light that is to be incident on the secondary lens 18 can be suppressed. Accordingly, the light transmittance of the secondary lens 18 can be improved, specifically, by 2 to 3%. As a result, power generation efficiency is improved.

Meanwhile, as shown in FIG. 6B, the resin receiving portion 17r extends from the inner edge 17e, which is in contact with the secondary lens 18, to the outer side without coming into contact with the secondary lens 18. Thus, even if the lower end of the covering portion 22c expands slightly outwardly, the expansion can be received.

That is, when the covering portion is formed by dripping liquid resin onto the secondary lens during the production process, the resin receiving portion 17r can serve as a receiver for the liquid resin, and thus, can inhibit the liquid resin from overflowing to the outside of the lens supporting portion 17a.

Figure 7A:
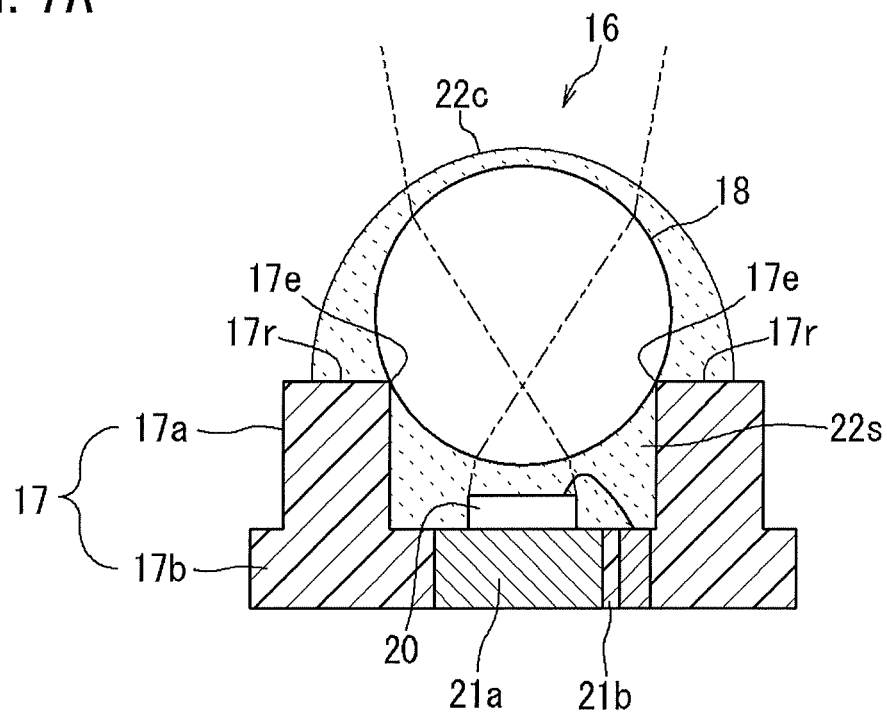
FIG. 7A is a diagram showing refraction of light caused by a secondary lens.
Figure 7B:
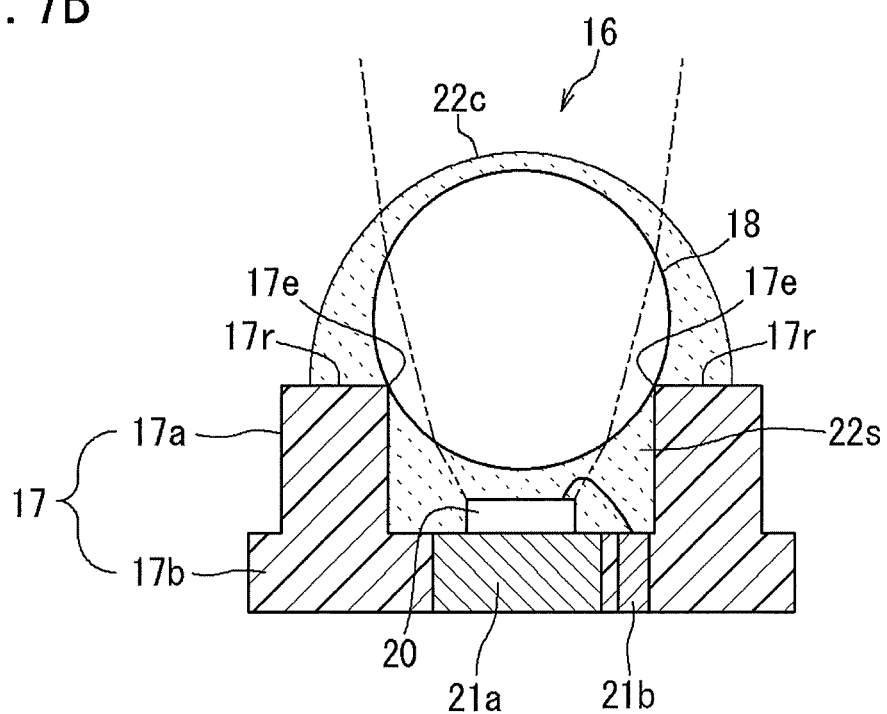
FIG. 7B is a diagram showing refraction of light caused by the secondary lens.

FIG. 7A and FIG. 7B are each a diagram showing refraction of light caused by the secondary lens 18. FIG. 7A shows refraction of light having a short wavelength (for example, ultraviolet light: wavelength 300 nm) in the light contained in sunlight. FIG. 7B shows refraction of light having a long wavelength (for example, infrared light: wavelength 2000 nm) in the light contained in sunlight. Due to the presence of the secondary lens 18, even if the optical axis of the incident light is slightly displaced, the light can be guided to the power generating element 20. That is, by providing, separately from the Fresnel lens 13f, the secondary lens 18 near the power generating element 20, it is possible to cause light energy to be concentrated to a small area, and to reduce influence of displacement of the optical axis of the secondary concentrating portion 16 relative to the Fresnel lens 13f serving as the primary concentrating portion. Accordingly, the concentrating accuracy can be increased.

Second Embodiment

Figure 8:
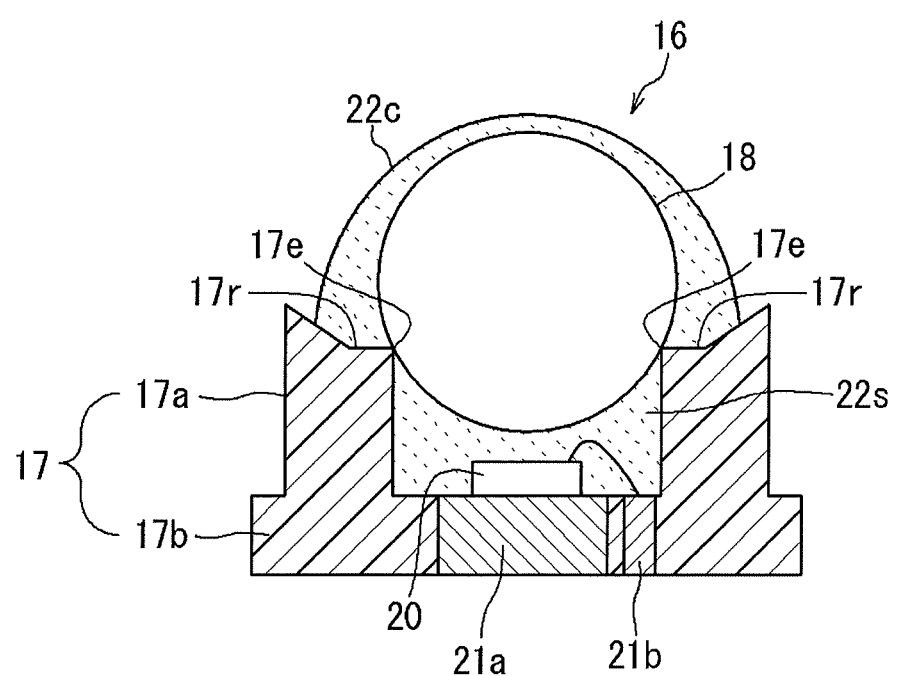
FIG. 8 is a cross-sectional view showing a second embodiment of the secondary concentrating portion.

FIG. 8 is a cross-sectional view showing a second embodiment of the secondary concentrating portion 16. The difference from the first embodiment (FIG. 6B) is the shape of the upper end face of the lens supporting portion 17a. That is, the upper end face of the lens supporting portion 17a is a flat face from the inner edge 17e to a midway point, but is upwardly inclined from the midway point to the outer edge. With this shape, the function as a "receiver" for receiving the lower end of the covering portion 22c during the production process is more effectively exerted, and the liquid resin can be reliably prevented from overflowing to the outside of the lens supporting portion 17a.

The configurations of other portions are the same as in the first embodiment, and thus, are denoted by the same reference signs as in the first embodiment, and description thereof is omitted.

Figure 9A:
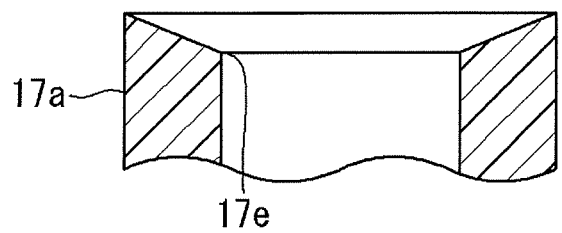
FIG. 9A is a cross-sectional view showing a variation of a lens supporting portion according to the second embodiment.
Figure 9B:
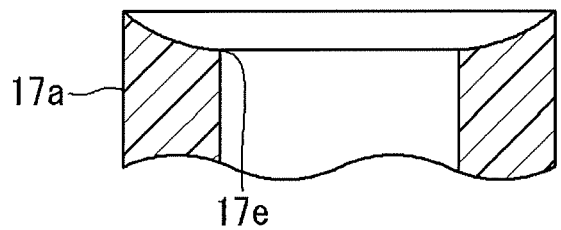
FIG. 9B is a cross-sectional view showing a variation of the lens supporting portion according to the second embodiment.
Figure 9C:
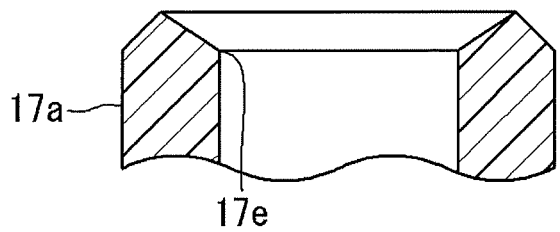
FIG. 9C is a cross-sectional view showing a variation of the lens supporting portion according to the second embodiment.
Figure 9D:
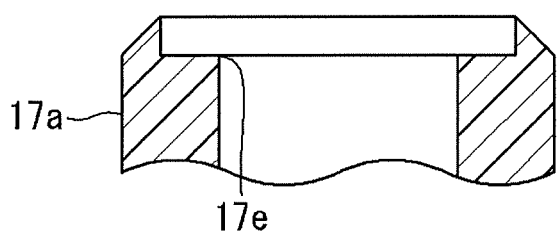
FIG. 9D is a cross-sectional view showing a variation of the lens supporting portion according to the second embodiment.

FIG. 9A, FIG. 9B, FIG. 9C, and FIG. 9D are each a cross-sectional view showing a variation of the lens supporting portion 17a of the second embodiment. FIG. 9A shows an example in which the upper end face is inclined such that the height of the upper end face is gradually increased at a constant gradient from the inner edge 17e to the outer side. FIG. 9B shows an example in which the height of the upper end face is gradually increased in an arc shape from the inner edge 17e to the outer side. FIG. 9C shows an example in which the upper end face is upwardly inclined from the inner edge 17e to a midway point, and then, is downwardly inclined from the peak at the midway point to the outer side. FIG. 9D shows an example in which the upper end face is a flat face from the inner edge 17e to a midway point, is perpendicularly raised from the midway point to form a peak, and then, is downwardly inclined from the peak to the outer side.

FIG. 8 and the four examples of FIG. 9A, FIG. 9B, FIG. 9C, and FIG. 9D are merely examples. In short, it is sufficient that the upper end face of the lens supporting portion 17a includes a portion in a shape having a height increased from the inner edge thereof toward the outer side thereof.

In this case, when the covering portion 22c is formed by dripping liquid resin onto the secondary lens 18, the upper end face of the lens supporting portion 17a can serve as a receiver for the liquid resin, and can reliably prevent the liquid resin from overflowing to the outside.

Third Embodiment

Figure 10:
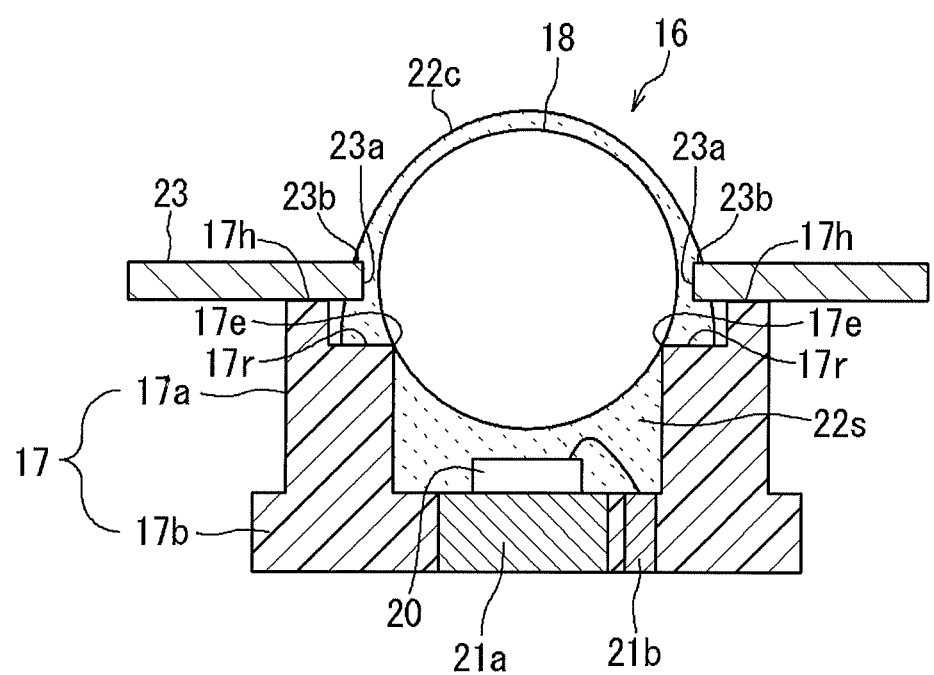
FIG. 10 is a cross-sectional view showing a third embodiment of the secondary concentrating portion.

FIG. 10 is a cross-sectional view showing a third embodiment of the secondary concentrating portion 16. The difference from the first embodiment (FIG. 6B) is the provision of a shielding plate 23 and the shape of the upper end face of the lens supporting portion 17a. The shielding plate 23 is a flat-plate-shaped member preventing sunlight to pass therethrough, and is a disk-like member having a hole 23a formed in the center thereof, thus having a washer-like shape. However, the contour of the shielding plate 23 may be circular or quadrangular. As the shielding plate 23, a light-weighted member having heat resistance is suitable, and the material thereof is metal, for example (aluminium, iron, copper, for example). Thus, an inexpensive member having a simple shape and a light weight can be used as the shielding plate 23. The shielding plate 23 may be made of ceramic, instead of metal.

The shielding plate 23 is fixed in a state of being mounted to the lens supporting portion 17a, with an upper portion of the secondary lens 18 exposed from the hole 23a. The shielding plate 23 blocks light converging at a position outside the secondary lens 18, and prevents burning of the package 17 including the lens supporting portion 17a and others under the shielding plate 23.

That is, in such a configuration of the secondary concentrating portion 16, the shielding plate 23 serves as one element of the secondary concentrating portion, and is fixed in a state of being mounted to the lens supporting portion 17a. For example, when displacement of the optical axis (OFF-AXIS) of converging light has occurred due to tracking deviation, the light converging at a position outside the secondary lens 18 is blocked by the shielding plate 23, whereby burning of the lens supporting portion 17a and others under the shielding plate 23 can be prevented.

The upper end face of the lens supporting portion 17a has a two-stage shape in which the inner side thereof is low and the outer side thereof is high. The lower stage portion at the inner side is the resin receiving portion 17r, receives the lower end of the covering portion 22c, and supports the secondary lens 18 at the inner edge 17e. A higher stage portion 17h at the outer side serves a seat at which the shielding plate 23 is placed.

With this shape, the shielding plate 23 can be supported at the higher stage portion 17h, and the secondary lens 18 can be supported at the resin receiving portion 17r at the lower stage portion. In addition, when the covering portion 22c is formed by dripping liquid resin onto the secondary lens 18, the resin receiving portion 17r at the lower stage portion can serve as a receiver for the liquid resin, and the higher stage portion 17h reliably prevents the liquid resin from overflowing to the outside. It should be noted that the liquid resin is dripped into the resin receiving portion 17r through the gap between the secondary lens 18 and the inner periphery of the hole 23a in the shielding plate 23, and is solidified. As a result, an edge portion 23b of the hole 23a in the shielding plate 23 is entered into the covering portion 22c. Thus, the shielding plate 23 can be fixed by the covering portion 22c.

Fourth Embodiment

Figure 11:
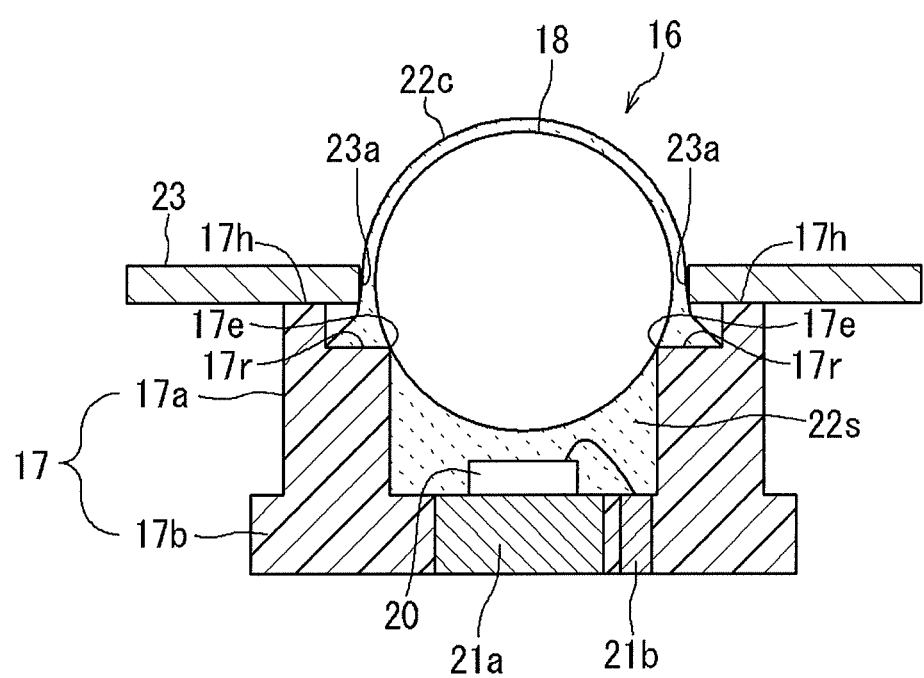
FIG. 11 is a cross-sectional view showing a fourth embodiment of the secondary concentrating portion.

FIG. 11 is a cross-sectional view showing a fourth embodiment of the secondary concentrating portion 16. The difference from the third embodiment (FIG. 10) is that the inner diameter of the hole 23a in the shielding plate 23 is greater than the outer diameter of the secondary lens 18 provided with the covering portion 22c. In this case, after the covering portion 22c is formed, the shielding plate 23 can be mounted without causing interference with the covering portion 22c. The shielding plate 23 can be fixed by being bonded to the upper face of the higher stage portion 17h.

Fifth Embodiment

Figure 12:
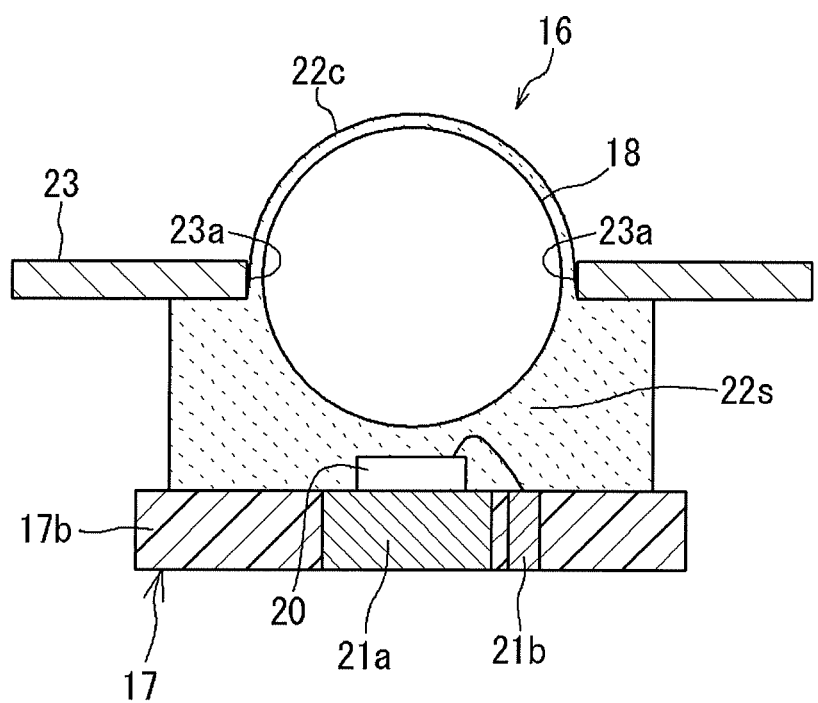
FIG. 12 is a cross-sectional view showing a fifth embodiment of the secondary concentrating portion.

FIG. 12 is a cross-sectional view showing a fifth embodiment of the secondary concentrating portion 16. The difference from the third and fourth embodiments (FIG. 10, FIG. 11) is that the sealing portion 22s also functions as a lens supporting portion. The shielding plate 23 is also fixed to the sealing portion 22s also functioning as the lens supporting portion. Thus, the lens supporting portion as a part of the package 17 is not present in this embodiment. The sealing portion 22s is also connected to the covering portion 22c. The inner diameter of the hole 23a in the shielding plate 23 is greater than the outer diameter of the secondary lens 18 provided with the covering portion 22c.

The sealing portion 22s and the covering portion 22c as shown in FIG. 12 can be made through resin molding, for example.

In this case, the respective portions having stable quality can be uniformly made.

Sixth Embodiment

Figure 13:
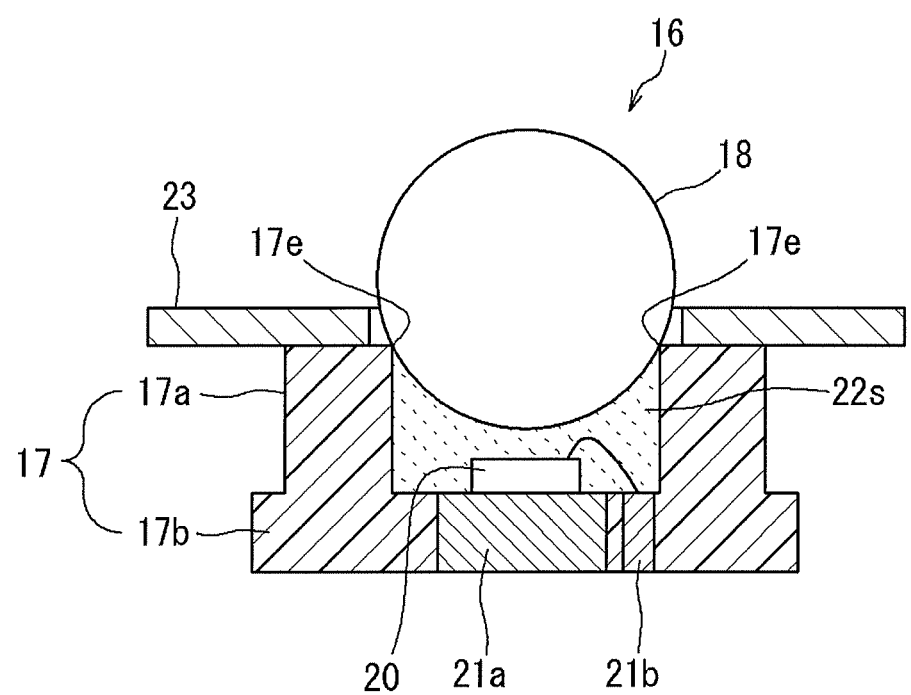
FIG. 13 is a cross-sectional view showing a sixth embodiment of the secondary concentrating portion.

FIG. 13 is a cross-sectional view showing a sixth embodiment of the secondary concentrating portion 16. The difference from the third and fourth embodiments (FIG. 10, FIG. 11) is that the covering portion is omitted and the upper end face of the lens supporting portion 17a is a flat face. The lens supporting portion 17a supports the secondary lens 18 at the inner edge 17e, and also serves as a seat which supports the shielding plate 23 and to which the shielding plate 23 is fixed. In this case, the shape of the upper end face of the lens supporting portion 17a is simple.

Seventh Embodiment

Figure 14:
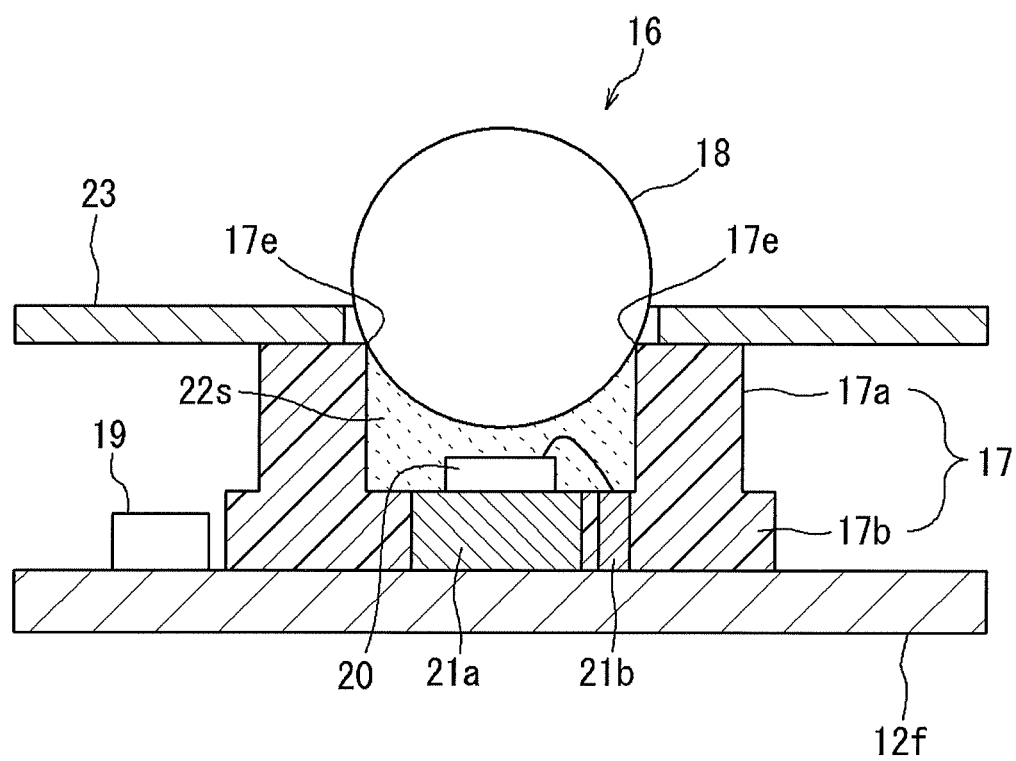
FIG. 14 is a cross-sectional view showing a seventh embodiment of the secondary concentrating portion.

FIG. 14 is a cross-sectional view showing a seventh embodiment of the secondary concentrating portion 16. The difference from the sixth embodiment (FIG. 13) is that the shielding plate 23 is further enlarged.

The shielding plate 23 in this case also shields the bypass diode 19 provided at the flexible substrate 12f and near the package 17, from light converging at a position outside the secondary lens 18. In other words, the shielding plate 23 has a size that allows provision of shielding also for the bypass diode 19. Thus, the shielding plate 23 can also prevent burning of the bypass diode 19.

It should be noted that the shielding plate 23 can be used also in the third to the sixth embodiments.

<<Variation of Secondary Lens>>

In the above embodiments regarding the secondary concentrating portion 16, the secondary lens 18 has been described as a sphere lens which is representative. However, the secondary lens 18 is not limited to the sphere lens, and can have any of various other shapes.

FIG. 15A, FIG. 15B, FIG. 15C, FIG. 16A, FIG. 16B and FIG. 16C are each a diagram showing a variation of the shape of the secondary lens 18.

Figure 15A:
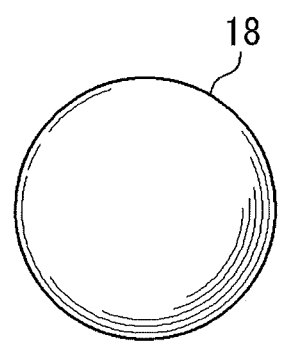
FIG. 15A is a diagram showing a variation of the shape of the secondary lens.

As the shape of the secondary lens, any of the following shapes can be employed, alternatively to the already-shown spherical shape in FIG. 15A.

Figure 15B:
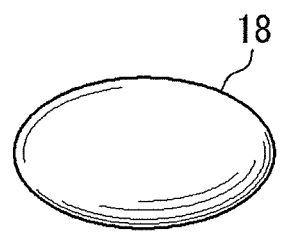
FIG. 15B is a diagram showing a variation of the shape of the secondary lens.

Ellipsoid type shown in FIG. 15B: body of revolution of an ellipse.

Figure 15C:
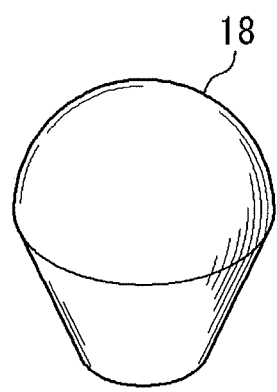
FIG. 15C is a diagram showing a variation of the shape of the secondary lens.

Hemisphere plus inverted circular cone type shown in FIG. 15C: a hemisphere at the upper part plus an inverted circular cone as the lower part.

Figure 16A:
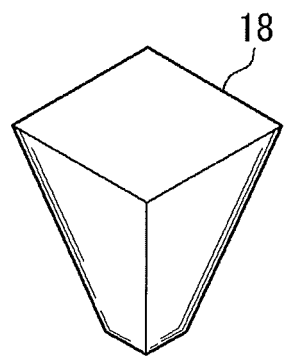
FIG. 16A is a diagram showing a variation of the shape of the secondary lens.

Homogenizer type shown in FIG. 16A: a flat surface (square) as the upper face plus a truncated pyramid (truncated quadrangular pyramid).

Figure 16B:
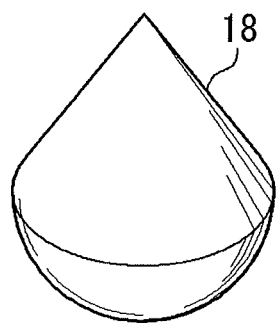
FIG. 16B is a diagram showing a variation of the shape of the secondary lens.

Drop type shown in FIG. 16B: a circular cone as the upper part and a hemisphere as the lower part.

Figure 16C:
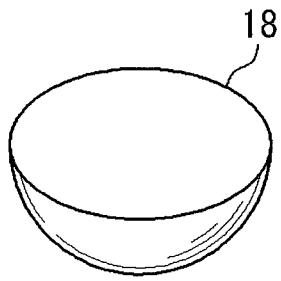
FIG. 16C is a diagram showing a variation of the shape of the secondary lens.

Planoconvex type shown in FIG. 16C: a circular flat surface as the upper face plus a hemisphere therebelow.

Each of the various shapes as described above has, at least partially, one or more of a spherical surface, an ellipsoid surface, a circular cone surface, an inverted truncated pyramid surface. The secondary lens 18 having such a shape acts to guide received light downward, i.e., to the power generating element, while causing the light to be refracted or totally reflected.

According to the secondary lens having such a shape is advantageous in that, even when the optical axis thereof is slightly displaced relative to the primary concentrating portion, the amount of light to be guided to the power generating element is not greatly reduced. The lens supporting portion can be made so as to suit any of these various shapes.

<<Module/Panel/Apparatus>>

According to the secondary concentrating portion 16 described above, in the first and second embodiments, a structure that is easy to be produced and that increases light transmittance can be realized. In the third to seventh embodiments, protection of surroundings of the power generating element at the time when the light concentration position is displaced can be realized by means of a simple and easy-to-produce structure. In each embodiment, completeness of the secondary concentrating portion 16 is enhanced, and stable performance of the concentrator photovoltaic unit 1U is realized.

Similarly, stable performance can be realized in the concentrator photovoltaic module 1M, the concentrator photovoltaic panel 1, and further, the concentrator photovoltaic apparatus 100 that includes the driving device 200 configured to drive the concentrator photovoltaic panel 1 such that the concentrator photovoltaic panel 1 tracks the movement of the sun while facing the direction of the sun.

<<Supplementary Note>>

It should be noted that the embodiments disclosed herein are merely illustrative and not restrictive in all aspects. The scope of the present invention is defined by the scope of the claims, and is intended to include meaning equivalent to the scope of the claims and all modifications within the scope.

However, the embodiments of the present invention described above include an invention presented in the additional note below, for example, in addition to the invention described in the claims.

(Additional Note 1)

A concentrator photovoltaic unit configured to guide sunlight concentrated by a primary concentrating portion, to a power generating element by means of a secondary concentrating portion, wherein when upper-lower positional relationship on an optical path is defined such that the primary concentrating portion is at an upper position than the secondary concentrating portion, the secondary concentrating portion includes:
a secondary lens provided above the power generating element;
a lens supporting portion being a mount, the mount surrounding the power generating element and configured to have the secondary lens mounted thereto, the lens supporting portion being configured to support the secondary lens in a state where the secondary lens is disposed with a gap above the power generating element;
a covering portion made of translucent resin, the covering portion being configured to cover a surface of the secondary lens; and
a sealing portion made of translucent resin, the sealing portion filling a space of the gap between the power generating element and the secondary lens, and
an upper end face of the lens supporting portion includes:
an inner edge in contact with the secondary lens; and
a resin receiving portion extending from the inner edge to an outer side without coming into contact with the secondary lens, the resin receiving portion receiving a lower end of the covering portion.

It should be noted that the upper end face may have a structure that includes a shape having a height increased from the inner edge thereof toward the outer side thereof.

REFERENCE SIGNS LIST 1 concentrator photovoltaic panel
1M concentrator photovoltaic module
1U concentrator photovoltaic unit
3 pedestal
3a post
3b base
4 tracking sensor
5 pyrheliometer
11a bottom face
11 housing
11b flange portion
12 flexible printed circuit
12f flexible substrate
13 primary concentrating portion
13f Fresnel lens
14, 15 connection box
16 secondary concentrating portion
17 package
17a lens supporting portion
17b bottom portion
17e inner edge
17h higher stage portion
17r resin receiving portion (lower stage portion)
18 secondary lens
19 bypass diode
20 power generating element
21a lead frame
21b lead frame
22c covering portion
22s sealing portion
23 shielding plate
23a hole
23b edge portion
100 concentrator photovoltaic apparatus
200 driving device
201e stepping motor
201a stepping motor
202 drive circuit
300 electric power meter
400 control device

The invention claimed is:

1. A concentrator photovoltaic unit configured to guide sunlight concentrated by a primary concentrating portion, to a power generating element by means of a secondary concentrating portion, wherein when upper-lower positional relationship on an optical path is defined such that the primary concentrating portion is at an upper position than the secondary concentrating portion, the secondary concentrating portion includes:
a secondary lens provided above the power generating element;
a supporting portion configured to support the secondary lens;
a shielding plate being a flat-plate-shaped member preventing sunlight from passing therethrough, the secondary lens being inserted into a hole formed in the flat-plate-shaped member to allow an upper portion of the secondary lens to be exposed from the hole, the shielding plate being mounted on an upper surface of the supporting portion, the shielding plate being configured to block light converging at a position outside the secondary lens; and
a covering portion being translucent and configured to cover a surface of the secondary lens, wherein
an inner dimension of the hole in the shielding plate is formed so as to be greater than an outer dimension of the secondary lens having the covering portion attached thereto.

2. The concentrator photovoltaic unit according to claim 1, wherein
the shielding plate is a disk-like member having the hole formed in a center thereof.

3. The concentrator photovoltaic unit according to claim 1, comprising:
a sealing portion made of translucent resin, the sealing portion filling a space of a gap between the power generating element and the secondary lens, in the supporting portion.

4. The concentrator photovoltaic unit according to claim 1, wherein
an upper end face of the supporting portion is a flat face configured to have the shielding plate to be fixed thereto, the upper end face being configured to support the secondary lens at an inner edge of the flat face.

5. The concentrator photovoltaic unit according to claim 3, wherein
the upper end face of the supporting portion includes:
a lower stage portion at an inner side, the lower stage portion being configured to support the secondary lens at an inner edge of the lower stage portion, and configured to serve as a resin receiving portion receiving a lower end of the covering portion; and a higher stage portion at an outer side, the higher stage portion being at a higher position than the lower stage portion and being configured to have the shielding plate mounted thereto.

6. The concentrator photovoltaic unit according to claim 5, wherein
an edge portion of the hole in the shielding plate is entered into the covering portion.

7. The concentrator photovoltaic unit according to claim 1, wherein the supporting portion is a part of a package accommodating the power generating element.

8. The concentrator photovoltaic unit according to claim 3, wherein
the sealing portion made of translucent resin and filling the space of the gap between the power generating element and the secondary lens also serves as the supporting portion.

9. The concentrator photovoltaic unit according to claim 1, wherein
the shielding plate has a size that allows the shielding plate to also shield a bypass diode from light converging at a position outside the secondary lens, the bypass diode being connected in parallel to the power generating element and being provided outside a package accommodating the power generating element.

10. A concentrator photovoltaic module formed by arranging a plurality of the concentrator photovoltaic units according to claim 1.

11. A concentrator photovoltaic panel formed by arranging a plurality of the concentrator photovoltaic modules according to claim 10.

12. A concentrator photovoltaic apparatus comprising:
the concentrator photovoltaic panel according to claim 11; and
a driving device configured to drive the concentrator photovoltaic panel such that the concentrator photovoltaic panel tracks movement of the sun while facing a direction of the sun.

13. A concentrator photovoltaic unit configured to guide sunlight concentrated by a primary concentrating portion, to a power generating element by means of a secondary concentrating portion, wherein
when upper-lower positional relationship on an optical path is defined such that the primary concentrating portion is at an upper position than the secondary concentrating portion,
the secondary concentrating portion includes:
a secondary lens provided above the power generating element;
a supporting portion configured to support the secondary lens;
a shielding plate being a disk-like member preventing sunlight from passing therethrough, the secondary lens being inserted into a hole formed in the disk-like member to allow an upper portion of the secondary lens to be exposed from the hole, the shielding plate being mounted on an upper surface of the supporting portion, the shielding plate being configured to block light converging at a position outside the secondary lens; and
a covering portion being translucent and configured to cover a surface of the secondary lens, wherein
an inner dimension of the hole in the shielding plate is formed so as to be greater than an outer dimension of the secondary lens having the covering portion attached thereto.

14. The concentrator photovoltaic unit according to claim 2, comprising:
a covering portion made of translucent resin, the covering portion being configured to cover a surface of the secondary lens; and
a sealing portion made of translucent resin, the sealing portion filling a space of a gap between the power generating element and the secondary lens, in the supporting portion.

15. The concentrator photovoltaic unit according to claim 2, wherein
an upper end face of the supporting portion is a flat face configured to have the shielding plate to be fixed thereto, the upper end face being configured to support the secondary lens at an inner edge of the flat face.

* * * * *